(12) United States Patent
Ueda

(10) Patent No.: US 11,201,038 B2
(45) Date of Patent: Dec. 14, 2021

(54) SUPPORT ASSEMBLY AND SUPPORT ASSEMBLY ASSEMBLING METHOD

(71) Applicant: TOKYO ELECTRON LIMITED, Tokyo (JP)

(72) Inventor: Takehiro Ueda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 265 days.

(21) Appl. No.: 16/206,100

(22) Filed: Nov. 30, 2018

(65) Prior Publication Data

US 2019/0172688 A1 Jun. 6, 2019

(30) Foreign Application Priority Data

Dec. 1, 2017 (JP) .............................. JP2017-231776

(51) Int. Cl.
*H01J 37/32* (2006.01)
*H01L 21/683* (2006.01)
*H01L 21/687* (2006.01)
*H01L 21/67* (2006.01)

(52) U.S. Cl.
CPC .. *H01J 37/32642* (2013.01); *H01J 37/32715* (2013.01); *H01L 21/67109* (2013.01); *H01L 21/6831* (2013.01); *H01L 21/6833* (2013.01); *H01L 21/68735* (2013.01); *H01J 2237/334* (2013.01); *H01L 21/67069* (2013.01)

(58) Field of Classification Search
CPC .......... H01J 37/32642; H01J 37/32715; H01L 21/67109; H01L 21/6831; H01L 21/6833; H01L 21/68735
See application file for complete search history.

(56) References Cited

U.S. PATENT DOCUMENTS

| 9,852,889 B1* | 12/2017 | Kellogg | H01J 37/32091 |
| 2007/0175861 A1* | 8/2007 | Hwang | H01J 37/3244 216/67 |
| 2009/0242127 A1 | 10/2009 | Koshimizu et al. | |
| 2010/0326957 A1 | 12/2010 | Maeda et al. | |
| 2013/0133833 A1* | 5/2013 | Carman | H01J 37/32477 156/345.43 |
| 2013/0228565 A1* | 9/2013 | Kondo | H01L 21/6831 219/538 |

(Continued)

FOREIGN PATENT DOCUMENTS

| CN | 101908460 A | 12/2010 |
| CN | 102208322 A | 10/2011 |

(Continued)

*Primary Examiner* — Kyle J Moody

(74) *Attorney, Agent, or Firm* — Rothwell, Figg, Ernst & Manbeck, P.C.

(57) ABSTRACT

A support assembly includes an electrostatic chuck, a lower electrode, one or more conductive members and a ring-shaped insulating member. The lower electrode has a chuck support surface which supports the electrostatic chuck and a ring support surface which supports an edge ring and surrounds the chuck support surface. A contact electrode is formed on the ring support surface. The conductive members electrically connect the contact electrode and the edge ring. The insulating member is interposed between the ring support surface of the lower electrode and the edge ring while enclosing the conductive members.

9 Claims, 9 Drawing Sheets

(56) References Cited

U.S. PATENT DOCUMENTS

| | | | |
|---|---|---|---|
| 2014/0011365 A1* | 1/2014 | Yasui | H01J 37/32082 |
| | | | 438/712 |
| 2017/0018411 A1* | 1/2017 | Sriraman | H01J 37/3211 |
| 2017/0117172 A1* | 4/2017 | Genetti | H01L 21/6719 |
| 2018/0012784 A1* | 1/2018 | Eto | H01J 37/32091 |
| 2018/0061696 A1* | 3/2018 | D'Ambra | H01L 21/6833 |
| 2018/0308737 A1* | 10/2018 | Moriya | H01L 21/68735 |
| 2019/0119815 A1* | 4/2019 | Park | H01L 21/02274 |

FOREIGN PATENT DOCUMENTS

| | | |
|---|---|---|
| CN | 106233435 A | 12/2016 |
| JP | 2009-239222 A | 10/2009 |
| JP | 2011-210958 A | 10/2011 |

* cited by examiner

SUPPORT ASSEMBLY AND SUPPORT ASSEMBLY ASSEMBLING METHOD

CROSS-REFERENCE TO RELATED APPLICATIONS

This application claims priority to Japanese Patent Application No. 2017-231776 filed on Dec. 1, 2017, the entire contents of which are incorporated herein by reference.

FIELD

The present disclosure relates to a support assembly and a support assembly assembling method.

BACKGROUND

In manufacturing electronic devices, plasma processing is performed to process a substrate. The plasma processing is performed by a plasma processing apparatus. The plasma processing apparatus generally includes a chamber main body, a stage, and a high frequency power supply. The chamber main body defines an inner space as a chamber. The stage is provided in the chamber. The stage has a lower electrode and an electrostatic chuck. The electrostatic chuck is provided on the lower electrode. The high frequency power supply supplies a high frequency power to the lower electrode to generate plasma of a gas in the chamber. An edge ring is provided on the stage to surround an edge of the substrate mounted on the electrostatic chuck. The edge ring is provided to allow ions to be incident on the substrate perpendicularly to the substrate.

The edge ring is consumed as the plasma processing time is increased. When the edge ring is consumed, a thickness of the edge ring is decreased. When the thickness of the edge ring is decreased, a shape of a sheath above the edge ring and an edge region of the substrate is changed. When the shape of the sheath is changed, a direction of ions incident on the edge region of the substrate is inclined with respect to a vertical direction. As a result, an opening formed at the edge region of the substrate is inclined with respect to a thickness direction of the substrate, which results in an in-plane etching rate variation.

In order to form an opening extending in parallel to the thickness direction of the substrate in the edge region of the substrate and to make the in-plane etching rate uniform, it is required to correct the inclination of the incident direction of ions to the edge region of the substrate by controlling the shape of the sheath above the edge ring and the edge region of the substrate. If it is possible to control the shape of the sheath above the edge ring and the edge region of the substrate, it is possible to deal with the consumption of the edge ring and also possible to select various etching conditions.

There has been developed a plasma processing apparatus configured to apply a negative DC voltage to the edge ring to control the shape of the sheath above the edge ring and the edge region of the substrate. Such a plasma processing apparatus is described in, e.g., Japanese Patent Application Publication No. 2009-239222.

When a voltage is applied to the edge ring during the plasma processing, abnormal discharge may occur between the edge ring and the lower electrode. In this technical field, it is required to apply a voltage to the edge ring while suppressing abnormal discharge with a simple configuration.

SUMMARY

In accordance with an aspect, there is provided a support assembly including an electrostatic chuck, a lower electrode, one or more conductive members and a ring-shaped insulating member. The lower electrode has a chuck support surface which supports the electrostatic chuck and a ring support surface which supports an edge ring and surrounds the chuck support surface. A contact electrode is formed on the ring support surface. The conductive members electrically connect the contact electrode and the edge ring. The insulating member is interposed between the ring support surface of the lower electrode and the edge ring while enclosing the conductive members.

In accordance with another aspect, there is provided a support assembly assembling method. The method comprises a preparation step, a forming step and a fixing step. In the preparation step, an electrostatic chuck, an edge ring, a lower electrode having a chuck support surface which supports the electrostatic chuck and a ring support surface which supports the edge ring and surrounds the chuck support surface, and an insulating member enclosing one or more conductive members are preparaded. In the forming step, a contact electrode is formed on the ring support surface. In the fixing step, the edge ring is fixed on the ring support surface through the insulating member to electrically connect the contact electrode, the one or more conductive members and the edge ring.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
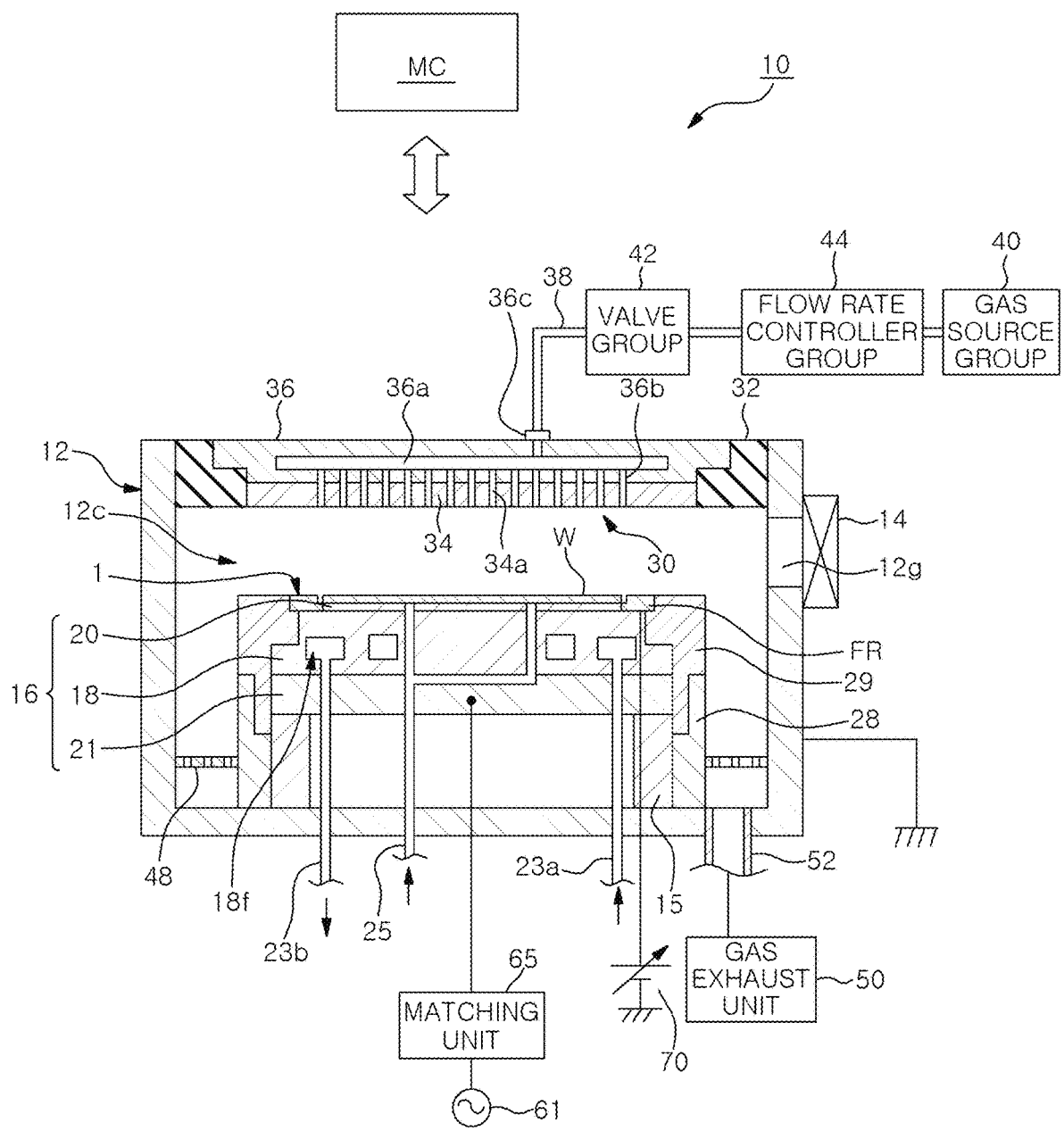
FIG. 1 schematically shows an example of a plasma processing apparatus including a support assembly according to a first embodiment.

Hereinafter, embodiments will be described in detail with reference to the accompanying drawings. Like reference numerals will be given to like or corresponding parts throughout the drawings.

First Embodiment

<Outline of Plasma Processing Apparatus>

FIG. 1 schematically shows an example of a plasma processing apparatus including a support assembly according to a first embodiment. A plasma processing apparatus shown in FIG. 1 is, e.g., a capacitively coupled plasma processing apparatus 10. The plasma processing apparatus 10 includes a chamber main body 12. The chamber main body 12 has a substantially cylindrical shape. The chamber body 12 defines an inner space as a chamber 12c. The chamber main body 12 is made of, e.g., aluminum. The chamber main body 12 is connected to a ground potential. A plasma resistant film is formed on an inner wall surface of the chamber main body 12, i.e., a wall surface defining the chamber 12c. The film may be a film formed by anodic oxidation treatment or a ceramic film such as a film made of yttrium oxide. A passage 12g is formed in a sidewall of the chamber main body 12. When the substrate W is loaded into the chamber 12c and unloaded from the chamber 12c, the substrate W passes through the passage 12g. A gate valve 14 is provided at the sidewall of the chamber main body 12 to open and close the passage 12g.

In the chamber 12c, a supporting portion 15 extends upward from a bottom portion of the chamber main body 12. The supporting portion 15 has a substantially cylindrical shape and is made of an insulating material such as quartz. A stage 16 is mounted on the supporting portion 15 and supported by the supporting portion 15. The stage 16 is configured to support the substrate W in the chamber 12c. The stage 16 includes a lower electrode 18 and an electrostatic chuck 20. In one embodiment, the stage 16 further includes an electrode plate 21. The electrode plate 21 is made of a conductive material such as aluminum or the like and has a substantially disc shape. The lower electrode 18 is provided on the electrode plate 21. The lower electrode 18 is made of a conductive material such as aluminum or the like and has a substantially disc shape. The lower electrode 18 is electrically connected to the electrode plate 21.

A flow path 18f is provided in the lower electrode 18. The flow path 18f is a channel for a heat exchange medium. As for the heat exchange medium, a liquid coolant or a coolant (e.g., Freon) for cooling the lower electrode 18 by vaporization thereof is used. The heat exchange medium is supplied to the flow path 18f from a chiller unit (not shown) provided outside the chamber main body 12 through a line 23a. The heat exchange medium supplied to the flow path 18f is returned to the chiller unit through a line 23b. In this manner, the heat exchange medium is supplied to the flow path 18f and circulates between the flow path 18f and the chiller unit.

The electrostatic chuck 20 is provided on the lower electrode 18. The electrostatic chuck 20 includes a main body made of an insulator and a film-shaped electrode provided in the main body. A DC power supply is electrically connected to the electrode of the electrostatic chuck 20. When a voltage is applied from the DC power supply to the electrode of the electrostatic chuck 20, an electrostatic attractive force is generated between the substrate W mounted on the electrostatic chuck 20 and the electrostatic chuck 20. Due to the electrostatic attractive force thus generated, the substrate W is attracted to and held on the electrostatic chuck 20.

The plasma processing apparatus 10 further includes a gas supply line 25. The gas supply line 25 supplies a heat transfer gas, e.g., He gas, from a gas supply unit to a gap between an upper surface of the electrostatic chuck 20 and a backside (bottom surface) of the substrate W.

A cylindrical portion 28 extends upward from the bottom portion of the chamber main body 12. The cylindrical portion 28 extends along an outer periphery of the supporting portion 15. The cylindrical portion 28 is made of a conductive material and has a substantially cylindrical shape. The cylindrical portion 28 is connected to the ground potential. An insulating portion 29 is provided on the cylindrical portion 28. The insulating portion 29 has an insulating property and is made of ceramic such as quartz or the like. The insulating portion 29 has a substantially cylindrical shape and extends along an outer periphery of the electrode plate 21, an outer periphery of the lower electrode 18, and an outer periphery of the electrostatic chuck 20.

An edge ring FR is provided on an outer peripheral region of the electrostatic chuck 20. The edge ring FR has a substantially annular plate shape, and is made of, e.g., silicon. The edge ring FR is disposed to surround the edge of the substrate W.

The plasma processing apparatus 10 further includes an upper electrode 30. The upper electrode 30 is provided above the stage 16. The upper electrode 30 closes an upper opening of the chamber main body 12 together with a member 32 that has an insulating property. The upper electrode 30 is supported at an upper portion of the chamber main body 12 through the member 32. As will be described later, when a high frequency power supply 61 is electrically connected to the lower electrode 18, the upper electrode 30 is connected to the ground potential.

The upper electrode 30 includes a ceiling plate 34 and a holding body 36. A bottom surface of the ceiling plate 34 defines the chamber 12c. The ceiling plate 34 is provided with a plurality of gas injection holes 34a. The gas injection holes 34a penetrate through the ceiling plate 34 in a plate thickness direction (vertical direction). The ceiling plate 34 is made of, e.g., silicon. Alternatively, the ceiling plate 34 may have a structure in which a plasma resistant film is formed on a surface of an aluminum base material. The film may be a film formed by anodic oxidation treatment or a ceramic film such as a film made of yttrium oxide.

The holding body 36 detachably holds the ceiling plate 34. The holding body 36 may be made of a conductive material, e.g. aluminum or the like. A gas diffusion space 36a is provided inside the holding body 36. A plurality of gas holes 36b extends downward from the gas diffusion space 36a. The gas holes 36b communicate with the gas injection holes 34a. A gas inlet port 36c for introducing a gas into the gas diffusion space 36a is formed in the holding body 36. A gas supply line 38 is connected to the gas inlet port 36c.

A gas source group 40 is connected to the gas supply line 38 through a valve group 42 and a flow rate controller group 44. The gas source group 40 includes a plurality of gas sources. The valve group 42 includes a plurality of valves. The flow rate controller group 44 includes a plurality of flow rate controllers. Each of the flow rate controllers of the flow rate controller group 44 is a mass flow controller or a pressure control type flow rate controller. The gas sources of the gas source group 40 are connected to the gas supply line 38 through the corresponding valves of the valve group 42 and the corresponding flow rate controllers of the flow rate control group 44. The plasma processing apparatus 10 can supply gases from one or more gas sources selected among the plurality of gas sources of the gas source group 40 to the chamber 12c at individually controlled flow rates.

A baffle plate 48 is provided between the cylindrical portion 28 and the sidewall of the chamber main body 12. The baffle plate 48 may be formed by coating ceramic such as yttrium oxide or the like on an aluminum base material, for example. A plurality of through-holes is formed in the baffle plate 48. Below the baffle plate 48, a gas exhaust line 52 is connected to the bottom portion of the chamber main body 12. A gas exhaust unit 50 is connected to the gas exhaust line 52. The gas exhaust unit 50 includes a pressure controller such as an automatic pressure control valve and a vacuum pump such as a turbo molecular pump or the like, and thus can decrease a pressure in the chamber 12c.

The plasma processing apparatus 10 further includes the high frequency power supply 61. The high frequency power supply 61 generates a high frequency power for plasma generation. The high frequency power has a frequency within a range of 27 MHz to 100 MHz, e.g., 60 MHz. The high frequency power supply 61 is connected to the lower electrode 18 via a matching unit 65 and the electrode plate 21. The matching unit 65 matches an output impedance of the high frequency power supply 61 and an impedance of a load side (the lower electrode 18 side). The high frequency power supply 61 may be connected to the upper electrode 30 via the matching unit 65.

The plasma processing apparatus 10 further includes a variable DC power supply 70. The variable DC power supply 70 generates a negative DC voltage to be applied to the edge ring FR. In one example, the variable DC power supply 70 applies a negative DC voltage to the edge ring FR in order to control the shape of the sheath above the edge ring and the edge region of the substrate.

The plasma processing apparatus 10 may further include a main controller MC. The main control unit MC is a computer including a processor, a storage device, an input device, a display device and the like, and controls the respective components of the plasma processing apparatus 10. Specifically, the main control unit MC executes a control program stored in the storage device, and controls the respective components of the plasma processing apparatus 10 based on a recipe data stored in the storage device. Accordingly, the plasma processing apparatus 10 executes a process specified by the recipe data.

<Support Assembly>

Figure 2:
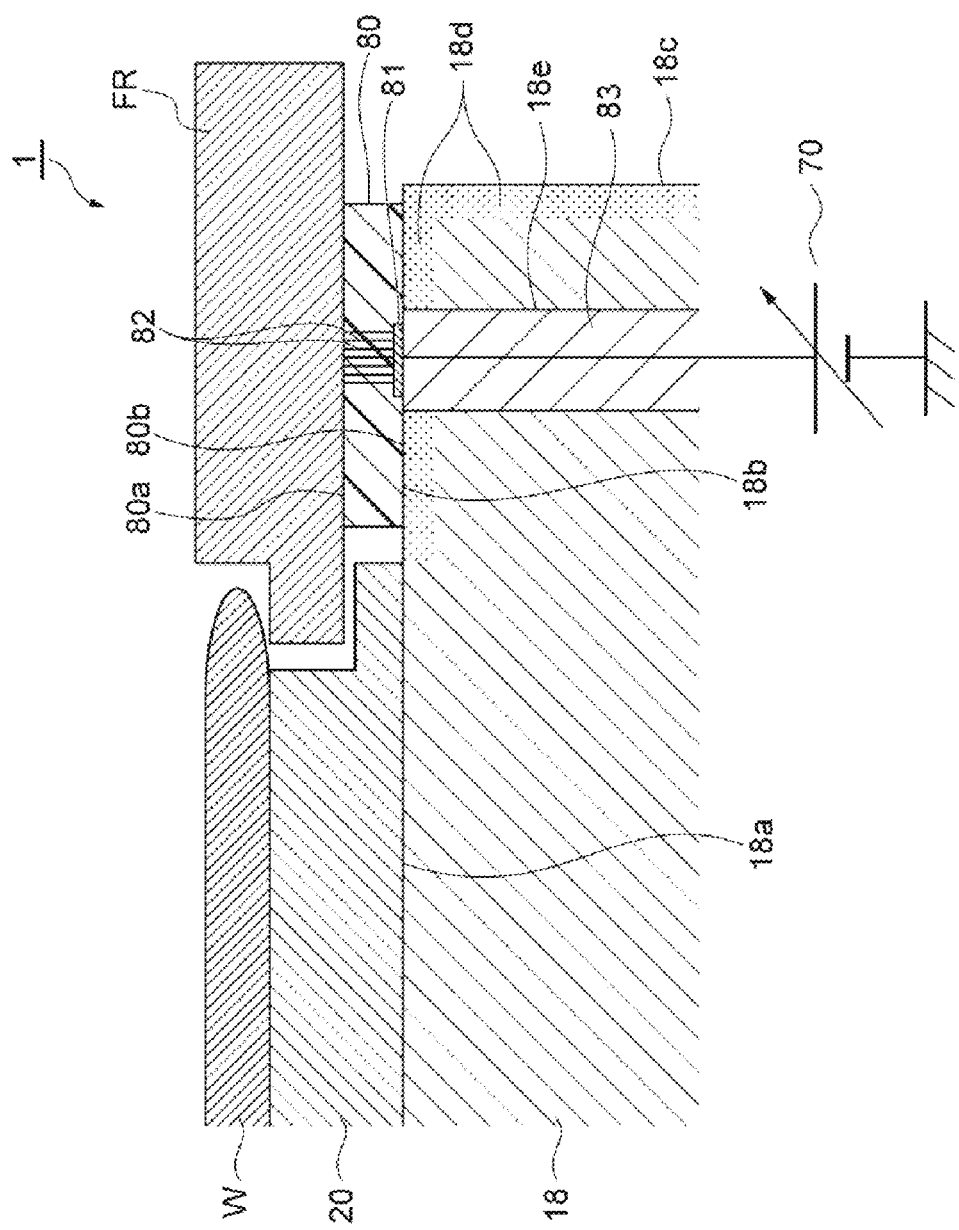
FIG. 2 is a partially enlarged cross sectional view of the support assembly shown in FIG. 1.
Figure 3:
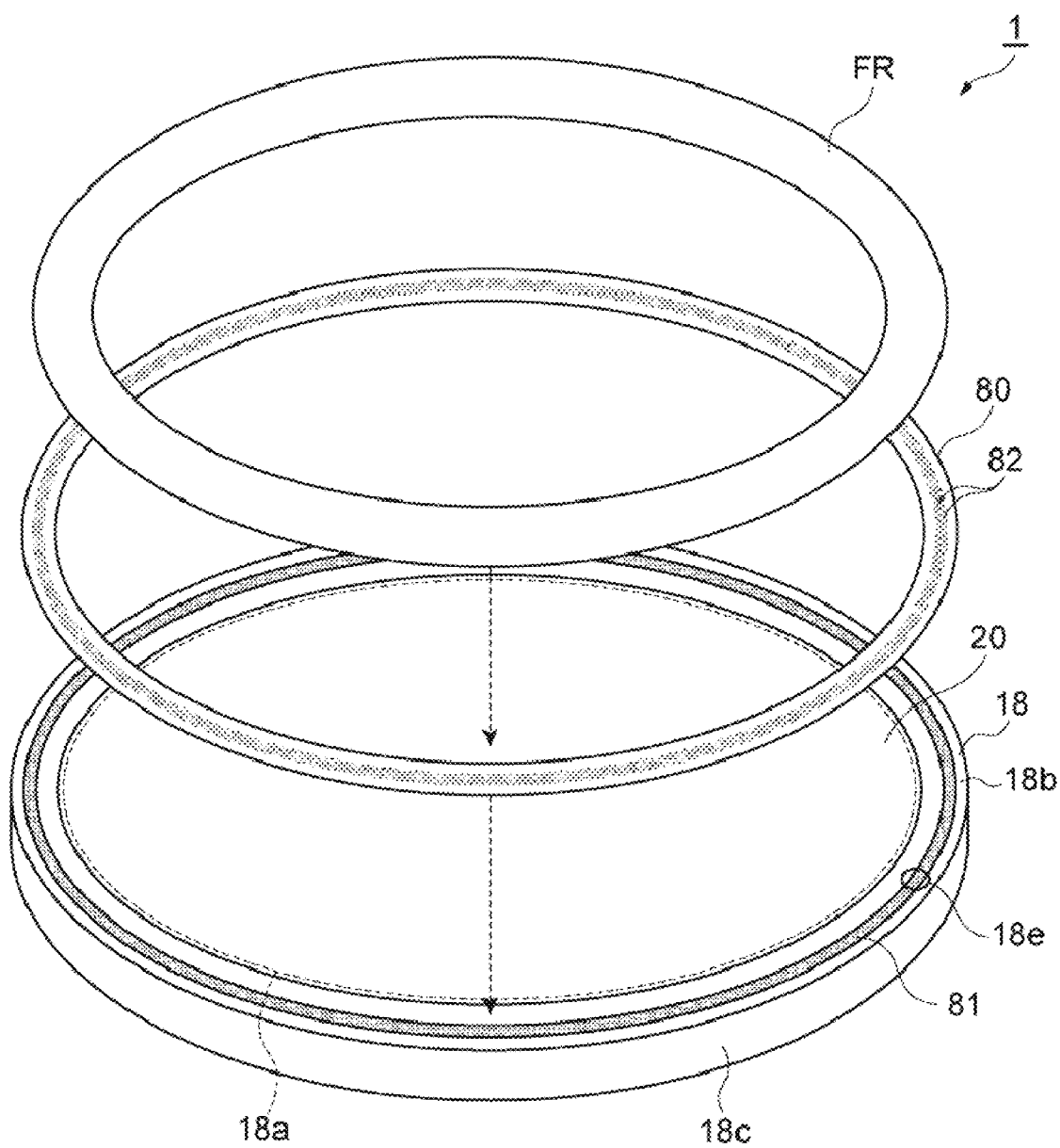
FIG. 3 is an exploded view of the support assembly shown in FIG. 1.

FIG. 2 is a partially enlarged cross sectional view of the support assembly shown in FIG. 1. FIG. 3 is an exploded view of the support assembly shown in FIG. 1. As shown in FIGS. 2 and 3, the support assembly 1 includes the electrostatic chuck 20, the lower electrode 18, one or more conductive members 82, and an insulating member 80.

The lower electrode 18 has on an upper surface thereof a chuck support surface 18a for supporting the electrostatic chuck 20 and a ring support surface 18b for supporting the edge ring. The chuck support surface 18a is a central circular region on the upper surface of the lower electrode 18, and has the same area as that of the electrostatic chuck 20. The ring support surface 18b is an edge region on the upper surface of the lower electrode 18 and surrounds the chuck support surface 18a. The ring support surface 18b and a side surface 18c of the lower electrode 18 are subjected to surface modification treatment to have insulation properties. In one example, an insulating film 18d such as a thermally sprayed alumina film or the like is formed on the ring support surface 18b and the side surface 18c.

A contact electrode 81 is formed on the ring support surface 18b on which the insulating film 18d is formed. The contact electrode 81 is formed along the entire circumference of the ring support surface 18b. The contact electrode 81 is made of a conductive material such as metal or the like. In one example, the contact electrode 81 is formed by thermally spraying tungsten. The contact electrode 81 may function as an electrical connection terminal. In other words, the contact electrode 81 does not necessarily have a continuous ring shape, and may be formed at a part of the circumference of the ring support surface 18b.

The contact electrode 81 is connected to the variable DC power supply 70. The variable DC power supply 70 is configured to supply a variable voltage. On the ring support surface 18b of the lower electrode 18A, a through-hole 18e extending to the bottom of the lower electrode 18 is formed at a position corresponding to the contact electrode 81. The through-hole 18e is filled with an insulating material 83, and accommodates therein a wiring that connects the contact electrode 81 and the variable DC power supply 70. The contact electrode 81 may be connected to a switch circuit and a DC power supply, instead of the variable DC power supply 70.

The insulating member 80 is interposed between the ring support surface 18b of the lower electrode 18 and the edge ring FR. The insulating member 80 is a ring-shaped sheet member whose upper surface 80a is in contact with the edge ring FR and lower surface 80b is in contact with the lower electrode 18. The insulating member 80 may have elasticity and adhesive properties. The insulating member 80 is made of synthetic resin mainly containing, e.g., silicone or the like.

The insulating member 80 is arranged to enclose one or more conductive members 82. To be more specific, the insulating member 80 encloses side portions of one or more conductive members 82. The conductive member 82 is a linear member extending in the thickness direction of the insulating member 80. The conductive member 82 is embedded in the insulating member 80. The conductive member 82 may be embedded in a central portion in an in-plane direction of the insulating member 80. Both ends of the conductive member 82 may protrude from the upper surface 80a and the lower surface 80b of the insulating member 80. The conductive member 82 may be embedded in the insulating member 80 such that both ends thereof protrude from the upper surface 80a and the lower surface 80b of the insulating member 80 when the conductive member 82 is interposed between the ring support surface 18b and the edge ring FR. The conductive member 82 may have a linear shape or may be curved. The conductive member 82 is disposed at a position overlapped with the contact electrode 81 when seen from a vertical direction. In the drawings, a plurality of conductive members 82 is arranged along the entire circumference of the ring-shaped insulating member 80. The upper end of the conductive member 82 is in contact with the lower surface of the edge ring FR, and the lower end of the conductive member 82 is in contact with the contact electrode 81. Accordingly, the conductive members 82 electrically connect the contact electrode 81 and the edge ring FR.

The edge ring FR is insulated from the lower electrode 18. A voltage is supplied from the variable DC power supply 70 to the edge ring FR via the conductive member 82 and the contact electrode 81.

<Assembly Method of Support Assembly>

Figure 4:
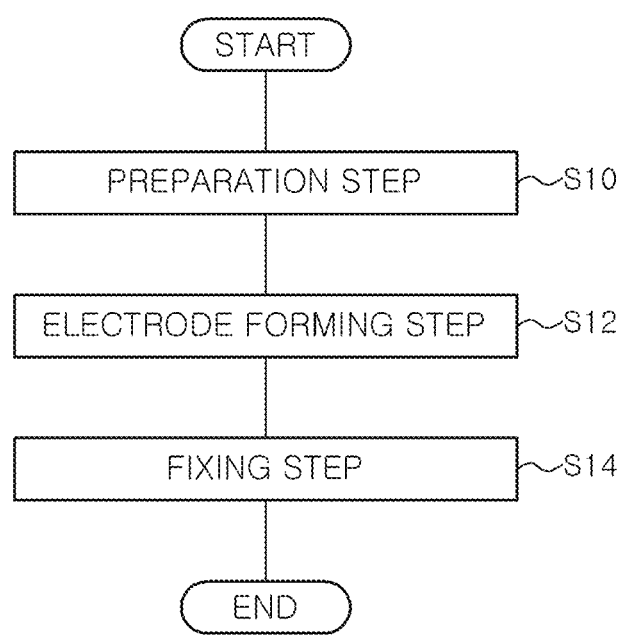
FIG. 4 shows an example of a method of assembling the support assembly.

FIG. 4 shows an example of a method of assemblying the support assembly. As shown in FIG. 4, first, in a preparation step (step S10), the electrostatic chuck 20, the edge ring FR, the lower electrode 18 having the chuck support surface 18a and the ring support surface 18b, and the insulating member 80 surrounding the conductive member 82 are prepared.

Next, in an electrode forming step (step S12), the contact electrode 81 is thermally sprayed on the lower electrode 18.

Then, in a fixing step (step S14), the electrostatic chuck 20 is fixed to the chuck support surface 18a through an adhesive; the insulating member 80 is disposed on the ring support surface 18b such that the contact electrode 81 and the conductive member 82 face each other; the edge ring FR is disposed on the insulating member 80; and the contact ring 81, the conductive member 82, and the edge ring FR are fixed while being electrically connected. When the insulating member 80 has adhesiveness, the lower electrode 18, the insulating member 80 and the edge ring FR are laminated in that order and pressed in the thickness direction. Accordingly, the edge ring FR is fixed.

<Summary of First Embodiment>

In the support assembly 1, the insulating member 80 is interposed between the ring support surface 18b of the lower electrode 18 and the edge ring FR while enclosing one or more conductive members 82. Accordingly, abnormal discharge can be suppressed. Further, the edge ring FR is connected to the contact electrode 81 through the conductive member 82. Therefore, the DC voltage applied to the contact electrode 81 is applied to the edge ring FR through the conductive member 82. In this manner, the support assembly 1 can apply a DC voltage to the edge ring FR while suppressing abnormal discharge without significant changes of the device. As a result, the support assembly 1 can apply a DC voltage to the edge ring FR while suppressing abnormal discharge with a simple configuration.

In the support assembly 1, the DC voltage is applied to the entire circumference of the edge ring FR and, thus, electrical and thermal variation can be reduced.

Second Embodiment

A support assembly 1A according to a second embodiment is the same as the support assembly 1 except that the power supply connected to the contact electrode 81 is different. In the second embodiment, redundant description of the same configurations as those in the first embodiment will be omitted.

Figure 5:
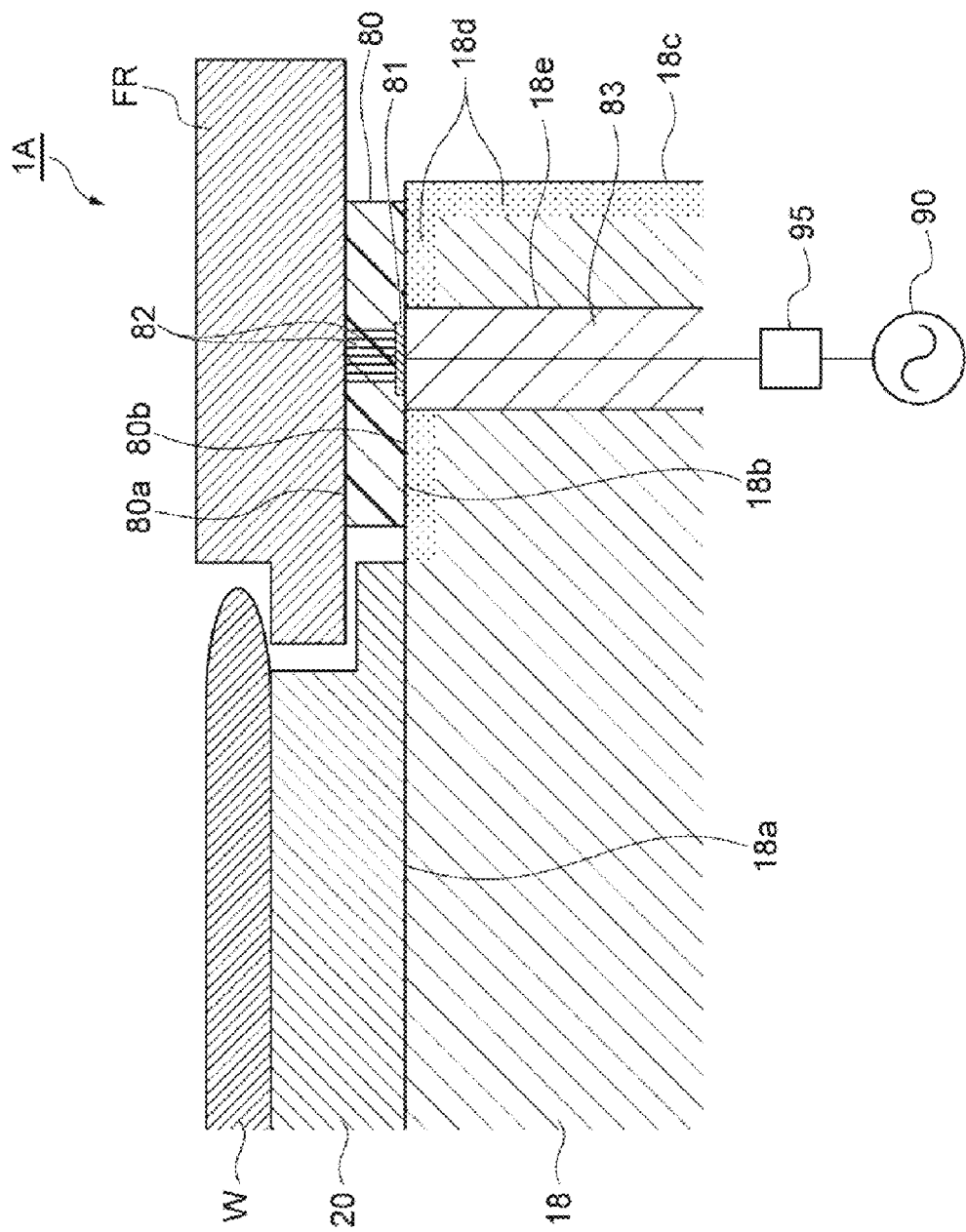
FIG. 5 shows an example of a support assembly according to a second embodiment.

FIG. 5 shows an example of the support assembly according to the second embodiment. As shown in FIG. 5, the contact electrode 81 of the support assembly 1A is connected to an AC power supply 90 via a matching device 95. The other configurations are the same as those of the first embodiment.

<Summary of Second Embodiment>

In the support assembly 1A, an insulating member 80 is interposed between the ring support surface 18b of the lower electrode 18 and the edge ring FR while enclosing one or more conductive members 82. Accordingly, abnormal discharge can be suppressed. Further, the edge ring FR is connected to the contact electrode 81 through the conductive member 82. Therefore, the AC voltage applied to the contact electrode 81 is applied to the edge ring FR through the conductive member 82. In this manner, the support assembly 1A can directly apply an AC voltage to the edge ring FR while suppressing abnormal discharge without significant changes of the device. As a result, the support assembly 1A can apply an AC voltage to the edge ring FR while suppressing abnormal discharge with a simple configuration.

In the support assembly 1A, the AC voltage is applied to the entire circumference of the edge ring FR and, thus, electrical and thermal variation can be reduced.

Third Embodiment

A support assembly 1B according to a third embodiment is the same as the support assembly 1 except that a through-hole 18e is not formed in the lower electrode 18 and the variable DC power supply 70 is directly connected to the lower electrode 18. In the third embodiment, redundant description of the same configuration as those in the first embodiment will be omitted.

Figure 6:
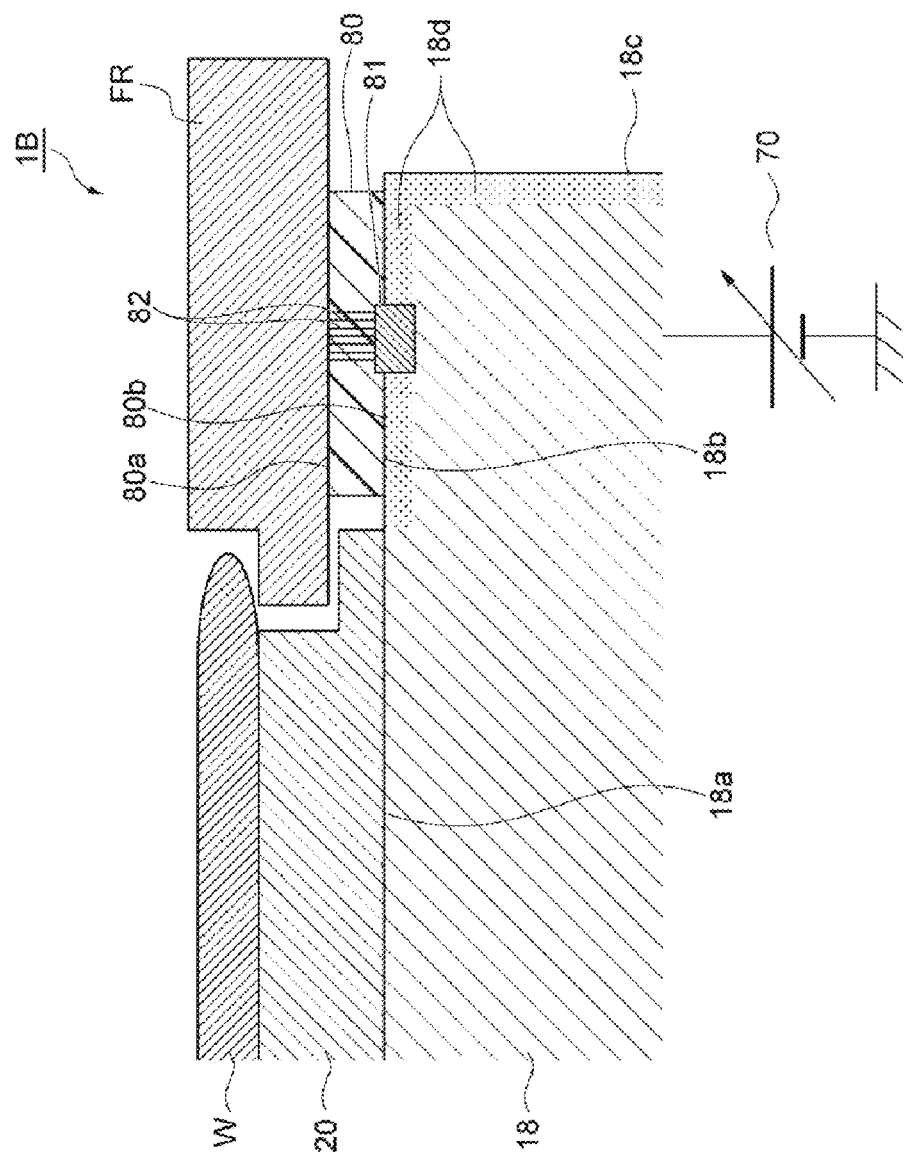
FIG. 6 shows an example of a support assembly according to a third embodiment.
Figure 7:
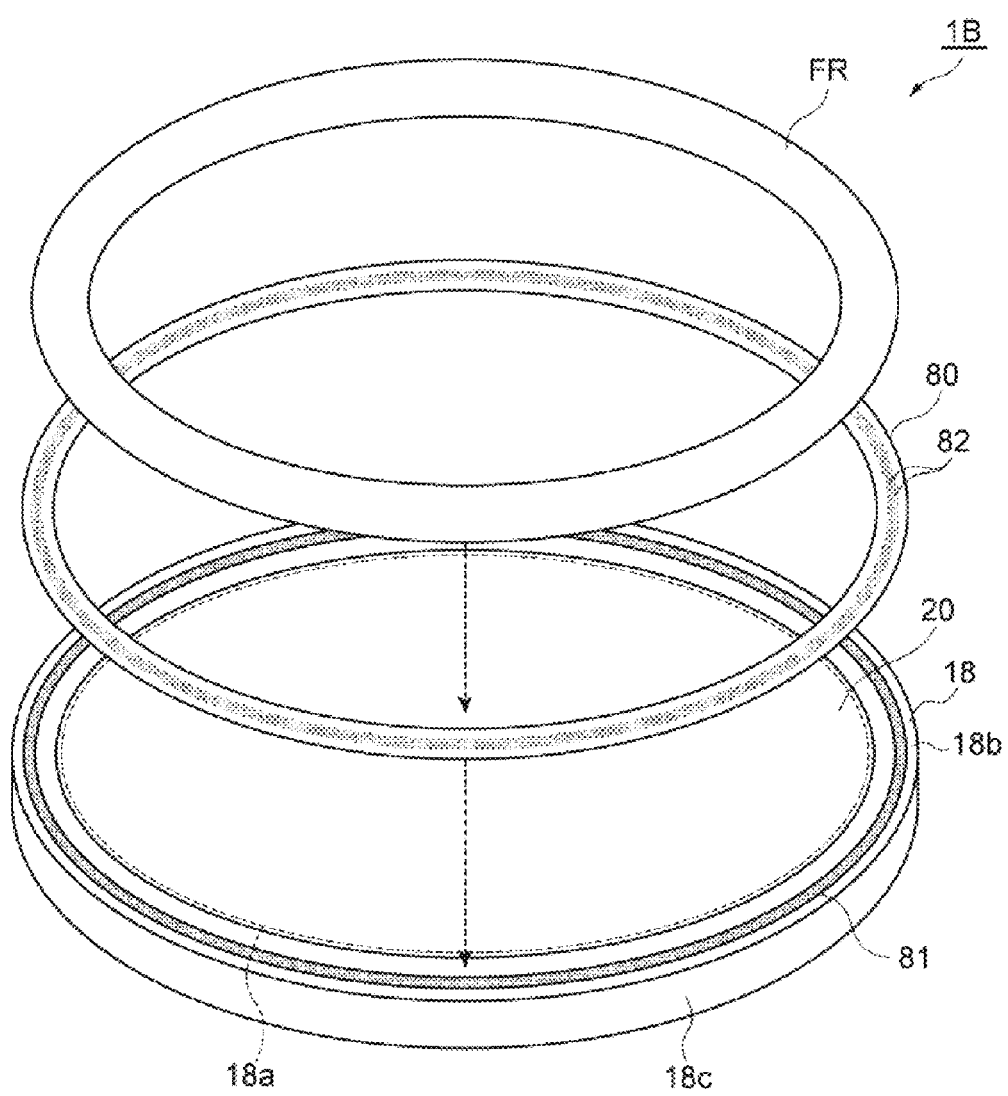
FIG. 7 is an exploded view of the support assembly shown in FIG. 6.

FIG. 6 shows an example of the support assembly according to the third embodiment. FIG. 7 is an exploded view of the support assembly shown in FIG. 6. As shown in FIGS. 6 and 7, a variable DC power supply 70 for supplying a voltage to the support assembly 1B is connected to the lower electrode 18. The DC voltage applied to the lower electrode 18 is superimposed on the high frequency power applied to the lower electrode 18 and is supplied to the edge ring FR. The other configurations are the same as those of the first embodiment.

<Summary of Third Embodiment>

In the support assembly 1B, an insulating member 80 is interposed between the ring support surface 18b of the lower electrode 18 and the edge ring FR while enclosing one or more conductive members 82. Accordingly, abnormal discharge can be suppressed. Further, the edge ring FR is connected to the contact electrode 81 through the conductive member 82. Therefore, the DC voltage applied to the contact electrode 81 is applied to the edge ring FR through the conductive member 82. In this manner, the support assembly 1B can apply a DC voltage to the edge ring FR while suppressing the abnormal discharge without significant changes of the device. As a result, the support assembly 1B can apply a DC voltage to the edge ring FR while suppressing abnormal discharge with a simple configuration.

In the support assembly 1B, a DC voltage is applied to the entire circumference of the edge ring FR and, thus, electrical and thermal variation can be reduced.

(Modification)

While various embodiments have been described, various modifications can be made without being limited to the above-described embodiments. For example, the plasma processing apparatus according to the above-described embodiments is a capacitively coupled plasma processing apparatus. The plasma processing apparatus according to the modification may be an inductively coupled plasma processing apparatus. Further, the edge ring FR may be divided. In that case, a voltage can be applied to each divided portion of the edge ring FR.

TEST EXAMPLES

The following is description on the effects of the embodiments which have been proven by the present inventor.

<Confirmation of Effects in the Case of Applying a Voltage to the Entire Circumference of the Edge Ring>

There were prepared a test example 1 in which a voltage can be applied to the entire circumference of the edge ring and a test example 2 in which a voltage can be applied to a part of the edge ring.

Test Example 1

The support assembly 1 of the first embodiment was prepared. The contact electrode 81 was formed along the entire circumference of the ring support surface 18b of the lower electrode 18. Then, the edge ring FR was fixed onto the ring support surface 18b through the insulating member 80 having the conductive member 82 embedded along the entire circumference thereof.

Test Example 2

The test example 2 was the same as the test example 1 except that the contact electrode 81 was formed on a part of the ring support surface 18b of the lower electrode 18 and the insulating member 80 was disposed at a position corresponding to the contact electrode 81. The contact electrode 81 and the insulating member 80 were disposed at four locations spaced apart from each other in the circumferential direction.

<Evaluation of Heat Emission>

Figure 8:
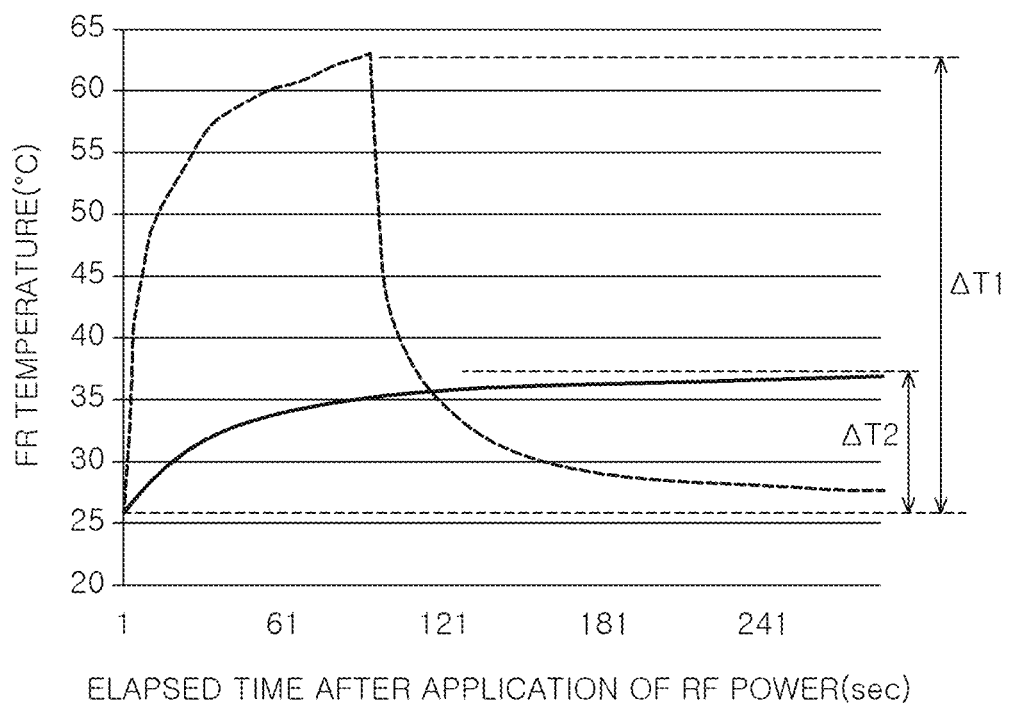
FIG. 8 is a graph obtained by evaluating the amount of heat emitted from an edge ring.

The high frequency power was applied to the lower electrode 18 while applying a DC voltage to the edge ring FR in each of the test examples 1 and 2, and changes in the temperature of the edge ring FR were measured. The high frequency power was 3.2 MHz/1 kW. The results are shown in FIG. 8. FIG. 8 is a graph obtained by evaluating the amount of heat emitted from the edge ring. The horizontal axis represents elapsed time after the application of the high frequency power, and the vertical axis represents the temperature of the edge ring FR. With respect to the temperature of the edge ring FR, maximum temperatures of the measurement points are plotted. A solid line indicates the test example 1, and a dashed line indicates the test example 2.

As shown in FIG. 8, in the test example 2 indicated by the dashed line graph, the temperature of the edge ring FR was rapidly increased after the application of the high frequency power by ΔT1 (about 36.9° C.) when about 100 seconds elapsed from the start. In consideration of the breakage of the edge ring FR, the measurement was terminated when the temperature was increased by ΔT1. On the other hand, in the test example 1 indicated by the solid line graph, the temperature of the edge ring FR was gradually increased as time elapsed, and was increased by ΔT2 (about 5.4° C.) even after about 250 seconds elapsed from the start. This shows that the amount of heat emitted from the edge ring RF is smaller when the voltage is applied to the entire circumference of the edge ring FR than when the voltage is applied to a part of the edge ring FR.

Figure 9A:
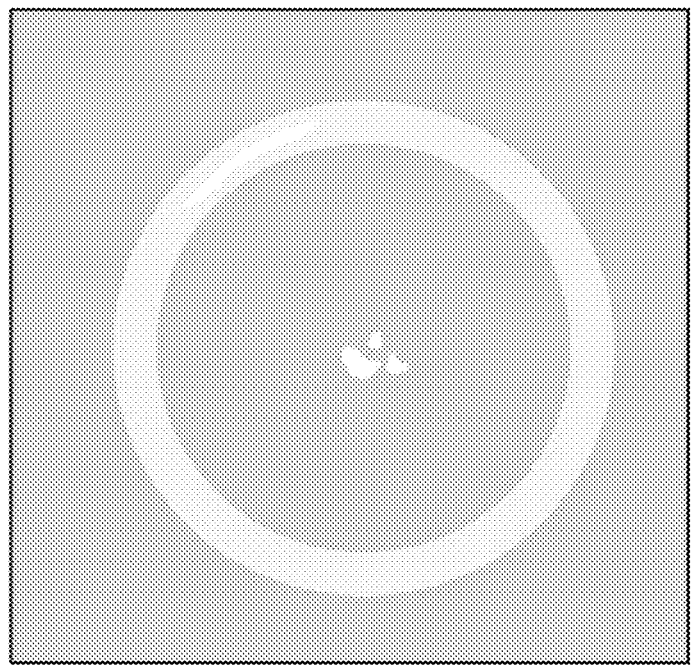
FIGS. 9A and 9B show results of evaluating temperature distribution of the edge ring.
Figure 9B:
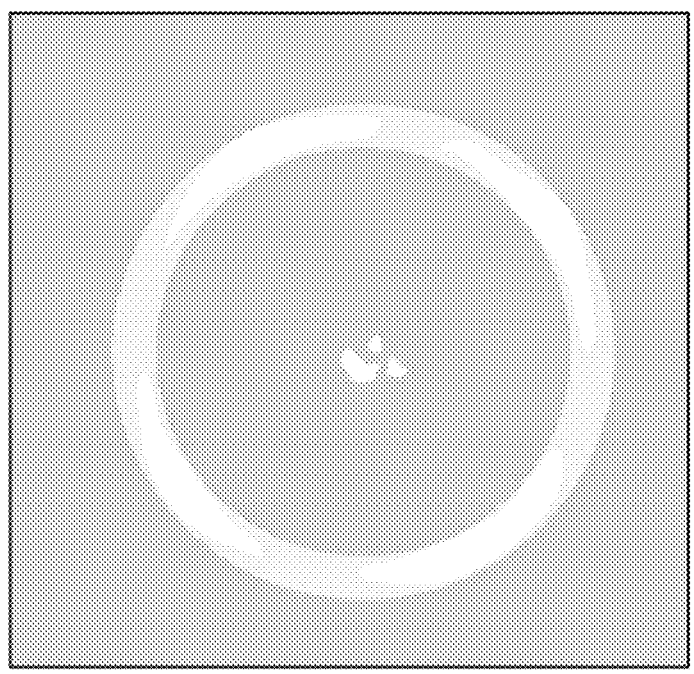

The high frequency power was applied to the lower electrode 18 while applying a DC voltage to each of the edge rings FR of the first embodiment and the second embodiment, and the temperature distribution of the edge ring FR was measured. FIGS. 9A and 9B show the results of evaluating the temperature distribution of the edge ring. FIG. 9A shows the temperature distribution of the test example 1. FIG. 9B shows the temperature distribution of the test example 2. As shown in FIGS. 9A and 9B, the temperature gradient is smaller in the temperature distribution of the test example 1 than in the temperature distribution of the test example 2. This shows that thermal variation can be reduced by applying a voltage to the entire circumference of the edge ring.

While the present disclosure has been shown and described with respect to the embodiments, it will be understood by those skilled in the art that various changes and modifications may be made without departing from the scope of the present disclosure as defined in the following claims.

What is claimed is:

1. A support assembly comprising:
   an electrostatic chuck;
   a lower electrode having a chuck support surface which supports the electrostatic chuck and a ring support surface which supports an edge ring and surrounds the chuck support surface, wherein a contact electrode is formed on the ring support surface;
   one or more conductive members configured to electrically connect the contact electrode and the edge ring; and
   a ring-shaped insulating member interposed between the ring support surface of the lower electrode and the edge ring, the insulating member enclosing said one or more conductive members.

2. The support assembly of claim 1, wherein the insulating member is made of synthetic resin containing silicone.

3. The support assembly of claim 1, e the contact electrode is provided along the entire circumference of the ring support surface, and
   said one or more conductive members are arranged along the entire circumference of the ring-shaped insulating member.

4. The support assembly of claim 1, wherein an upper surface of the insulating member is in contact with the edge ring and a lower surface of the insulating member is in contact with the lower electrode, and
   said one or more conductive members are linear members extending in a thickness direction of the insulating member.

5. The support assembly of claim 3, wherein an upper surface of the insulating member is in contact with the edge ring and a lower surface of the insulating member is in contact with the lower electrode, and
   said one or more conductive members are linear members extending in a thickness direction of the insulating member.

6. The support assembly of claim 1, wherein the contact electrode is connected to a DC power supply.

7. The support assembly of claim 1, wherein the contact electrode is connected to an AC power supply.

8. The support assembly of claim 1, wherein the edge ring is divided.

9. A support assembly assembling method, comprising:
   preparing an electrostatic chuck, an edge ring, a lower electrode having a chuck support surface which supports the electrostatic chuck and a ring support surface which supports the edge ring and surrounds the chuck support surface, and an insulating member enclosing one or more conductive members;
   forming a contact electrode on the ring support surface; and
   fixing the edge ring on the ring support surface through the insulating member to electrically connect the contact electrode, said one or more conductive members and the edge ring.

* * * * *